(12) United States Patent
Zhang et al.

(10) Patent No.: US 12,200,418 B2
(45) Date of Patent: Jan. 14, 2025

(54) MICROPHONE PACKAGE FOR EPOXY OVERFLOW PROTECTION GUARD RING IN CAVITY PCB

(71) Applicant: Knowles Electronics, LLC, Itasca, IL (US)

(72) Inventors: Shane Zhang, Suzhou (CN); Joshua Watson, Itasca, IL (US); Fisher Yu, Suzhou (CN); Jonas Shen, Suzhou (CN)

(73) Assignee: Knowles Electronics, LLC, Itasca, IL (US)

( * ) Notice: Subject to any disclaimer, the term of this patent is extended or adjusted under 35 U.S.C. 154(b) by 97 days.

(21) Appl. No.: 17/632,205

(22) PCT Filed: Dec. 30, 2019

(86) PCT No.: PCT/CN2019/129906
§ 371 (c)(1),
(2) Date: Feb. 1, 2022

(87) PCT Pub. No.: WO2021/134208
PCT Pub. Date: Jul. 8, 2021

(65) Prior Publication Data
US 2022/0286766 A1 Sep. 8, 2022

(51) Int. Cl.
*H04R 1/04* (2006.01)
*B81B 7/00* (2006.01)
*H01L 21/56* (2006.01)
*H04R 1/08* (2006.01)
*H04R 19/04* (2006.01)

(52) U.S. Cl.
CPC ............. *H04R 1/04* (2013.01); *B81B 7/0061* (2013.01); *H01L 21/56* (2013.01); *H04R 1/083* (2013.01); *H04R 19/04* (2013.01); *B81B 2201/0257* (2013.01); *H04R 2201/003* (2013.01); *H04R 2201/02* (2013.01)

(58) Field of Classification Search
CPC .... H04R 2201/003; H04R 1/04; H04R 1/083; B81B 7/0061
USPC ........................................................ 381/174
See application file for complete search history.

(56) References Cited

U.S. PATENT DOCUMENTS

| | | | |
|---|---|---|---|
| 2018/0029880 A1* | 2/2018 | Lim | ..................... H04R 31/006 |
| 2018/0343524 A1* | 11/2018 | Lim | ........................ H04R 1/04 |

FOREIGN PATENT DOCUMENTS

WO WO-2016043738 A1 * 3/2016 ............... B81B 7/02

* cited by examiner

*Primary Examiner* — Sunita Joshi
(74) *Attorney, Agent, or Firm* — FLENER IP & Business Law; Zareefa B. Flener

(57) ABSTRACT

A microphone assembly including an acoustic transducer that generates an electrical signal responsive to acoustic activity, and an integrated circuit electrically coupled to the acoustic transducer and that receives the electrical signal from the acoustic transducer and generate an output signal representative of the acoustic activity. The microphone assembly also includes a substrate comprising a first surface on which the integrated circuit is mounted, a guard ring mounted on the substrate and elevated relative to the first surface of the substrate, and a can mounted to the guard ring, wherein the can, the guard ring, and the substrate form a housing in which the transducer and integrated circuit are disposed.

12 Claims, 4 Drawing Sheets

MICROPHONE PACKAGE FOR EPOXY OVERFLOW PROTECTION GUARD RING IN CAVITY PCB

BACKGROUND

Microphone assemblies are utilized in a variety of applications, such as, mobile phones, and recording devices, to record acoustic signals. Microphone assemblies can include an encapsulating material over components of the microphone assembly. The encapsulating material can flow onto a bonding surface and reduce a strength of bonding of a can to the bonding surface.

BRIEF DESCRIPTION OF THE DRAWINGS

The foregoing and other features of the present disclosure will become more fully apparent from the following description and appended claims, taken in conjunction with the accompanying drawings. These drawings depict only several embodiments in accordance with the disclosure and are, therefore, not to be considered limiting of its scope. Various embodiments are described in more detail below in connection with the appended drawings.

DETAILED DESCRIPTION

Devices and methods are disclosed herein for providing microphone assemblies with guard rings. In particular, the microphone assemblies disclosed herein have a guard ring on a surface of the substrate which is formed during manufacturing of the microphone assemblies. The guard ring defines the bonding surface that couples to a can. The bonding surface is raised relative to the surface of the substrate. The guard ring may limit flow of the encapsulating material onto the bonding surface.

During production, a plurality of microphone assemblies may be formed as an array. The guard ring of each of the microphone assemblies of the array may be manufactured during a single manufacturing step, in some embodiments. The guard ring may be formed monolithically with the substrate or may be formed separate of and coupled to the substrate.

Among other benefits, a surface of the guard ring being raised relative to a surface of the substrate restricts the encapsulating material from flowing onto the surface of the guard ring. The integrity of the surface of the guard ring is maintained throughout the manufacturing process. The details of the general depiction provided above will be more fully explained by reference to FIGS. 1-6.

Figure 1:
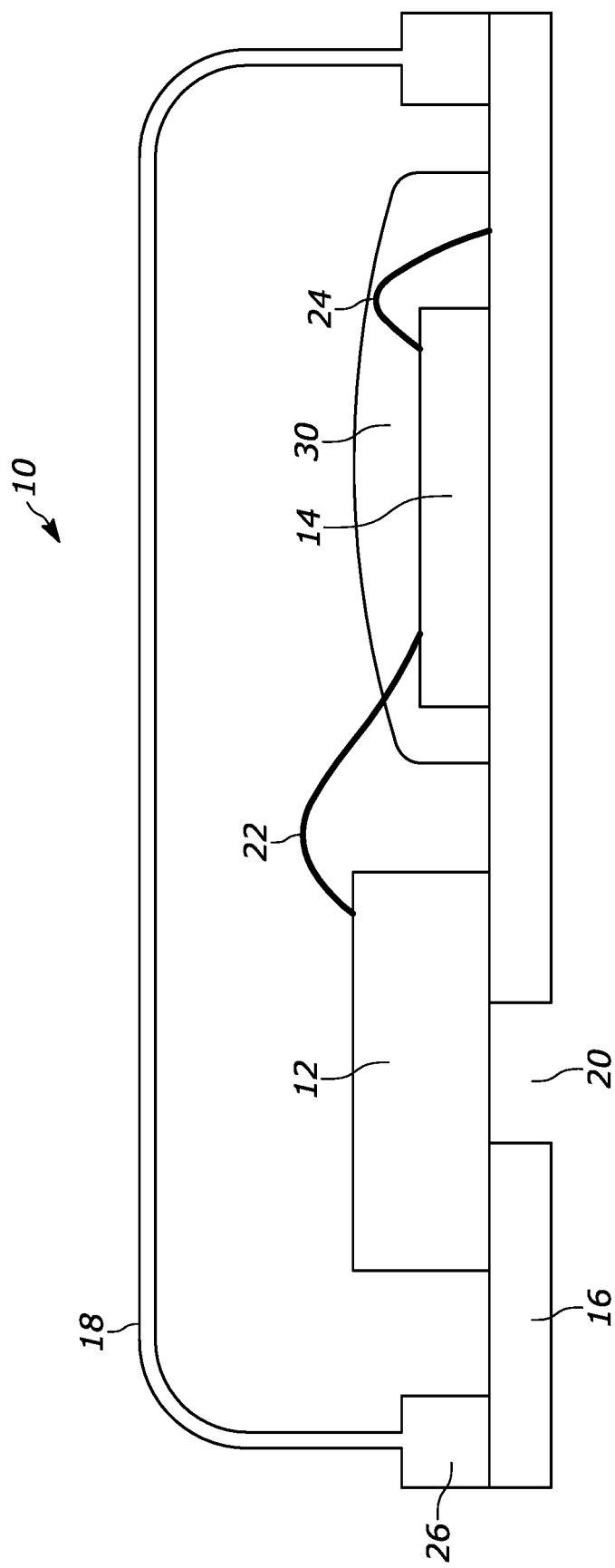
FIG. 1 is a partial-section view of a microphone assembly.

Referring now to FIG. 1, a cross-section view of a microphone assembly 10 is shown. Microphone assembly 10 is configured to sense acoustic activity (e.g., sound waves, etc.) and generate an electrical signal in response to the acoustic activity. Microphone assembly 10 is configured to be installed within a device (e.g., a mobile phone, a camera, a recorder, etc.). Microphone assembly 10 includes an acoustic transducer 12 configured to generate an electrical signal responsive to acoustic activity. In some embodiments, acoustic transducer 12 is a microelectromechanical systems (MEMS) transducer. In some implementations, acoustic transducer 12 is a capacitive transducer including one or more back plates and one or more diaphragms configured to move with respect to the back plate(s) to generate a variable capacitance indicative of sensed acoustic activity causing movement of the diaphragm. Microphone assembly 10 also includes an integrated circuit 14. Integrated circuit 14 is configured to receive the electrical signal from acoustic transducer 12 and generate an output signal representative of the acoustic activity. In some embodiments, integrated circuit 14 is an application specific integrated circuit (ASIC). Microphone assembly 10 also includes a substrate, shown as substrate 16. In some embodiments, substrate 16 is a printed circuit board. In some embodiments, acoustic transducer 12 and integrated circuit 14 are coupled to substrate 16. Microphone assembly 10 also includes a cover 18. In some embodiments, acoustic transducer 12 and/or integrated circuit 14 are coupled to cover 18. In some embodiments, cover 18 is a can, such as a metal can. Cover 18 is structured to define a housing between cover 18 and substrate 16.

In some embodiments, substrate 16 defines a port 20 formed through substrate 16. In other embodiments, cover 18 defines a port formed through can 18. Port 20 is structured to provide a pathway for acoustic signals to pass through substrate 16 or cover 18 and into contact with acoustic transducer 12. Acoustic transducer 12 and integrated circuit 14 are electrically coupled via wire 22. Wire 22 communicates signals from acoustic transducer 12 to integrated circuit 14. Integrated circuit 14 is electrically coupled to a contact on substrate 16 via wire 24. Signals may be transmitted to a device external of microphone assembly 10 through the contact on substrate 16 (e.g., via a contact formed on an external surface of substrate 16 in electrical connection with the contact to which wire 24 is connected).

Microphone assembly 10 also includes a guard ring 26. Guard ring 26 is coupled to the mounting surface on a periphery of substrate 16 and defines a first guard ring surface 28 (e.g., bonding surface, attachment surface, coupling surface, etc.). In some embodiments, the guard ring 26 is coupled to the bond pad on substrate 16. The periphery of substrate 16 is defined such that acoustic transducer 12 and integrated circuit 14 are within the periphery. In some embodiments, guard ring 26 is formed separate of substrate 16 and coupled to the mounting surface of substrate 16. Guard ring 26 defines a second guard ring surface. First guard ring surface 28 is opposite the second guard ring surface. Second guard ring surface is coupled to the mounting surface of substrate 16. In other embodiments, guard ring 26 and substrate 16 are formed as a monolithic structure. First guard ring surface 28 of guard ring 26 is raised relative to the mounting surface of substrate. Microphone assembly 10 includes an encapsulating material 30. Encapsulating material 30 covers at least one of wire 22, wire 24, or integrated circuit 14. Encapsulating material 30 isolates the component, which may maintain electrical connection and/or integrity of the component.

First guard ring surface 28 being raised relative to the mounting surface of substrate 16 defines a cavity in which encapsulating material 30 is disposed. First guard ring 26 limits flow of encapsulating material 30 from the cavity. In some embodiments, encapsulating material 30 is a liquid when flowed into the cavity and hardens over time. First guard ring surface 28 is limited from contact with encapsulating material 30.

Figure 2:
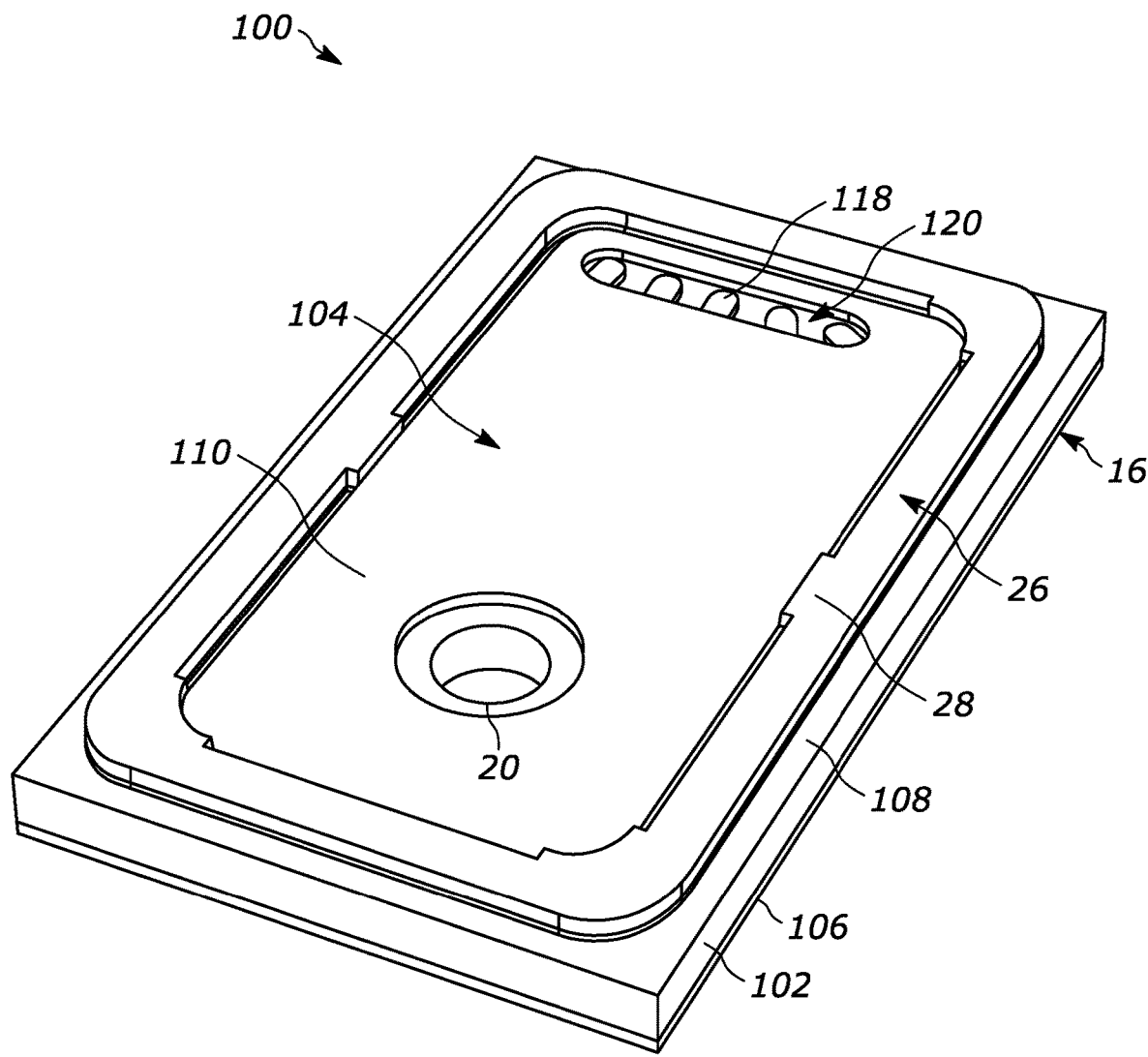
FIG. 2 is an illustration of a circuit board.

FIG. 2 is an illustration of a circuit board 100. Circuit board 100 may be used in microphone assembly 10. Circuit board 100 can include one or more layers to define substrate 16. Circuit board 100 also includes guard ring 26. Guard ring 26 may be formed monolithically with substrate 16 or separately of substrate 16 and coupled to a surface of substrate 16. Circuit board 100 also includes electrical traces 118. In some embodiments, electrical traces 118 are disposed on the surface of substrate 16. In other embodiments, electrical traces 118 are disposed beneath the surface of substrate 16. In this embodiment, an aperture 120 is formed within substrate 16 to facilitate access to electrical traces 118. Electrical traces 118 extend through substrate 16 to interface with an opposite side of substrate 16.

Figure 3:
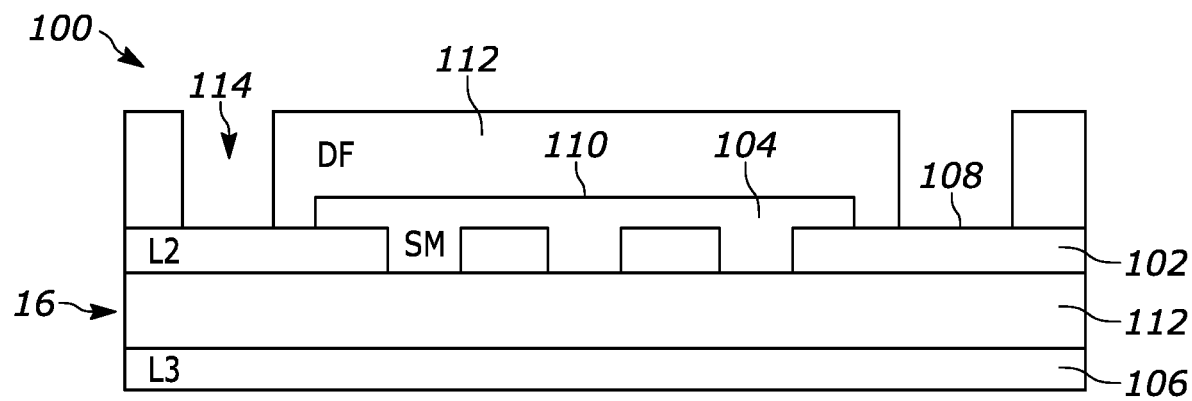
FIG. 3 is a partial-section view of a substrate during a step of manufacturing.

FIG. 3 is a partial view of circuit board 100 at one step of a manufacturing process. In the illustrated embodiment, substrate 16 includes a first layer 102, a second layer 104, and a third layer 106. First layer 102 defines a first surface 108 (e.g., an attachment surface, etc.). In some embodiments, first layer 102 is made from a conductive material. Second layer 104 is coupled to the first surface 108 of first layer 102. Second layer 104 defines a second surface 110. Second surface 110 may be a coupling surface for acoustic transducer 12 and/or integrated circuit 14. In some embodiments, second layer 104 is made from a non-conductive material, such as solder mask material. Third layer 106 is opposite first layer 102 on circuit board 100. In some embodiments, third layer 106 is made from a conductive material. In some embodiments, circuit board 100 also includes a fourth layer 112. Fourth layer 112 is disposed between first layer 102 and third layer 106. Fourth layer 112 can be configured to communicate electrical signals between first layer 102 and third layer 106. Fourth layer 112 can also be configured to limit communication of electrical signals between first layer 102 and third layer 106.

Circuit board 100 includes a dry film layer 112. Dry film layer 112 is coupled to first surface 108 and second surface 110. Dry film layer 112 defines a cavity 114. Cavity 114 extends around perimeter of substrate 16. In some embodiments, cavity 114 has a rectangular cross section. In other embodiments, cavity 114 has a trapezoidal cross section. Dry film layer 112 covers a portion of first layer 102 and defines a coupling surface 108 as an uncovered portion of first layer 102.

Figure 4:
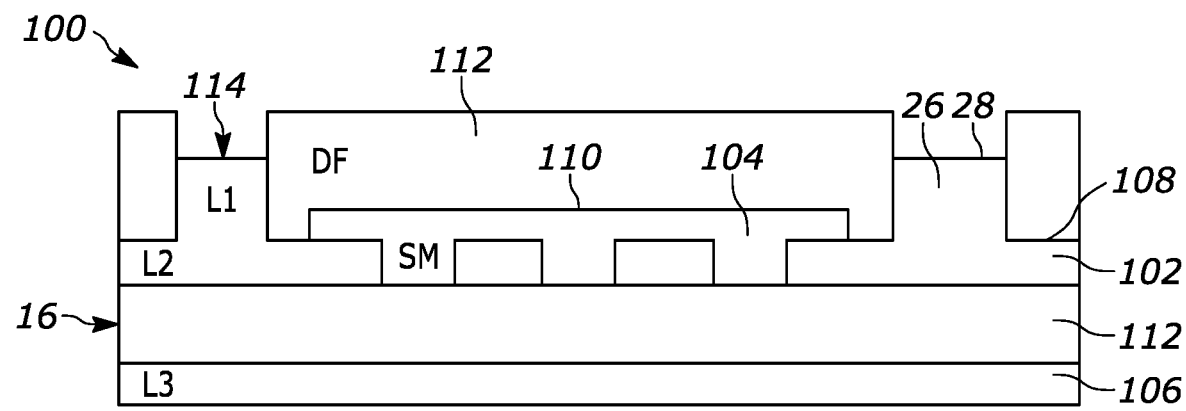
FIG. 4 is a partial-section view of a substrate during another step of manufacturing.

FIG. 4 is a partial view of circuit board 100 at a subsequent manufacturing step. A material has been deposited in cavity 114, defined by dry film layer 112, and coupled to coupling surface 108. The material takes the cross sectional shape of cavity 114 to define guard ring 26. The material can be copper, epoxy, silicone, or another material. In some embodiments, guard ring 26 is formed discrete of substrate 16 and coupled to coupling surface 108 of substrate 16 to form circuit board 100.

Figure 5:
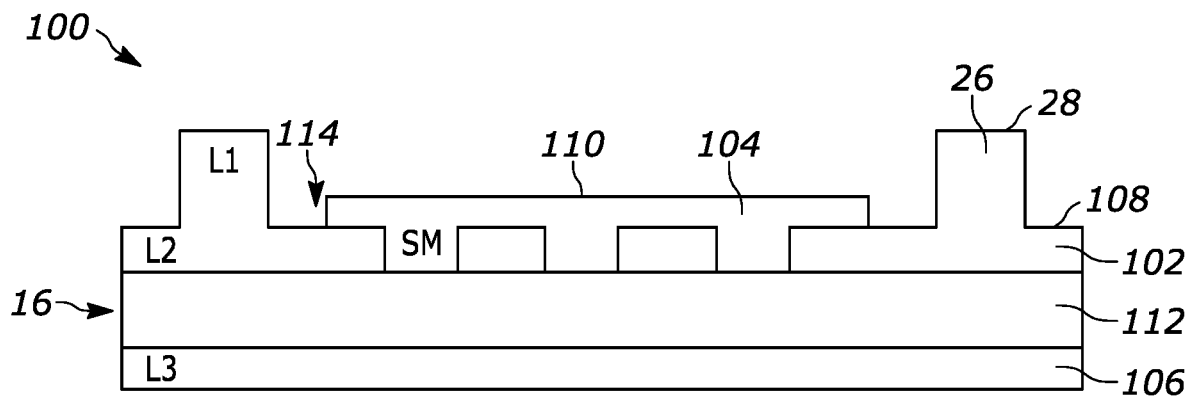
FIG. 5 is a partial-section view of a substrate during yet another step of manufacturing.

FIG. 5 is a partial view of circuit board 100 at a subsequent manufacturing step. Dry film layer 112 is removed from substrate 16. A fourth surface 28 (e.g., bonding surface, etc.) is defined on guard ring 26. Fourth surface 28 is raised relative to first surface 108 and second surface 110.

Figure 6:
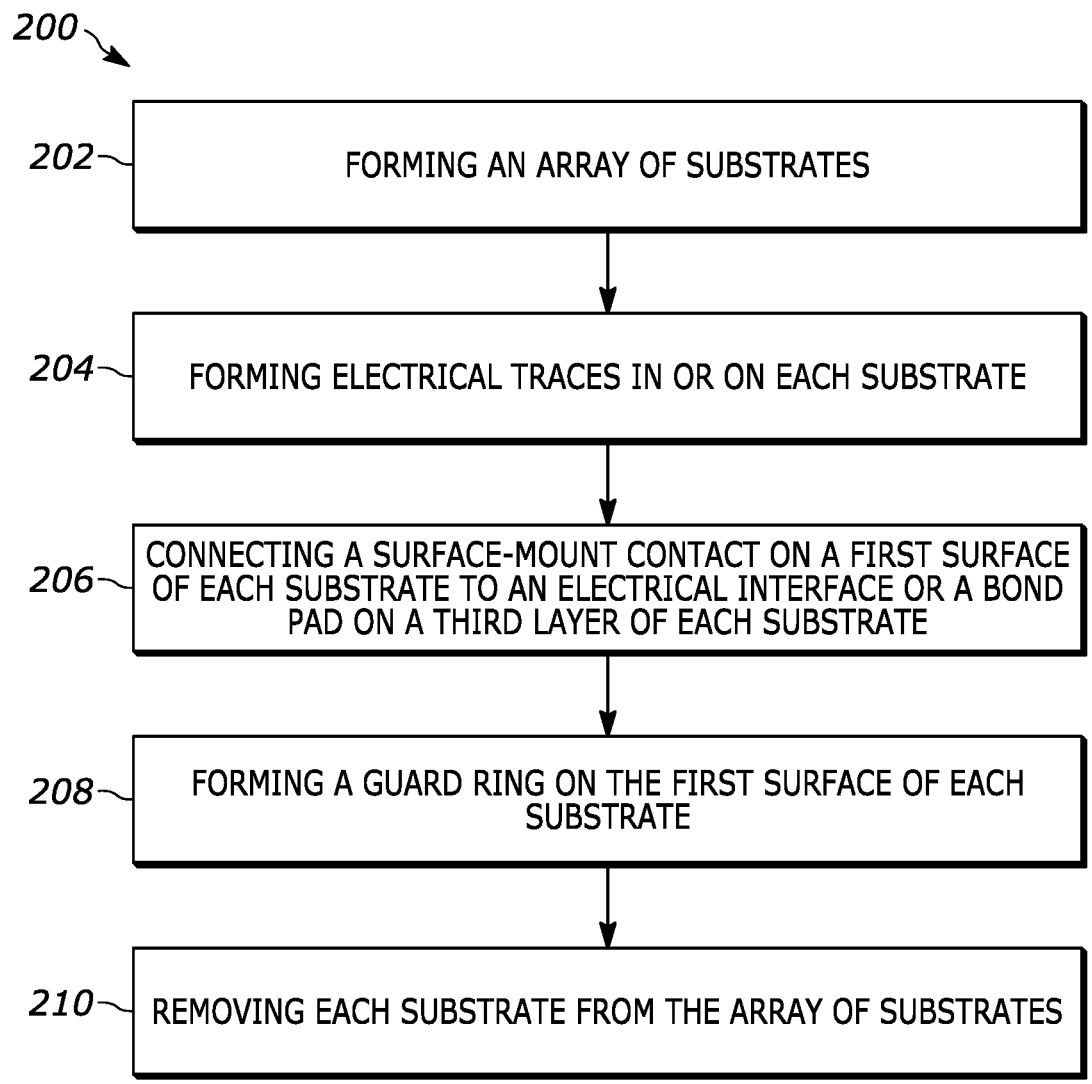
FIG. 6 is an illustration of a method of manufacturing a circuit board.

FIG. 6 depicts a method 200 of manufacturing circuit board 100 for microphone assembly 10. Method 200 is illustrative only; in other embodiments, some steps of method 200 may be performed in a different order and/or fewer or additional steps may be used without departing from the scope of the present disclosure.

At step 202, an array of substrates 16 are formed. The array includes two or more substrates 16. Each substrate 16 of the array include first layer 102, second layer 104, and third layer 106.

At step 204, electrical trace 118 is formed in or on each substrate 16 of the array. In some embodiments, electrical trace 118 is disposed on first layer 102. In other embodiments, electrical trace 118 is disposed on second layer 104. Electrical trace 118 may interface with a component external of microphone assembly 10.

At step 206, a surface-mount contact is connected on first surface 108 to an electrical interface or a bond pad on third layer 106. The connection between the surface-mount contact and the electrical interface or bond pad may be a wire or another conductive material extending between first surface 108 and third layer 106.

At step 208, guard ring 26 is formed on first surface 108 of each substrate 16 of the array. Guard ring 26 defines bonding surface 28 that is elevated relative to first surface 108. In some embodiments, guard ring 26 is formed as a monolithic structure with substrate 16. In this embodiment, first surface 108 may be provided with dry film layer 112 to define cavity 114. Cavity 114 is filled with guard ring material (e.g., copper, etc.). Dry film layer 112 is removed to define guard ring 26. In other embodiments, guard ring 26 is a discrete component of substrate 16 and coupled to first surface 108 of each substrate 16.

At step 210 each circuit board 100 is removed from the array, to define individual circuit boards 100. In some embodiments, a second layer of dry film is formed on first surface 108. The second layer of dry film defines a removal section, which is a location to remove a first circuit board 100 from a second circuit board 100 of the array of circuit boards 100.

A first aspect of the present disclosure relates to a microphone assembly. The microphone assembly includes an acoustic transducer that generates an electrical signal responsive to acoustic activity, and an integrated circuit electrically coupled to the acoustic transducer and that receives the electrical signal from the acoustic transducer and generate an output signal representative of the acoustic activity. The microphone assembly also includes a substrate comprising a first surface on which the integrated circuit is mounted, a guard ring mounted on the substrate and elevated relative to the first surface of the substrate, and a can mounted to the guard ring, wherein the can, the guard ring, and the substrate form a housing in which the transducer and integrated circuit are disposed.

A second aspect of the present disclosure relates to a circuit board for a microphone assembly. The circuit board includes a substrate. The substrate including a first surface. The circuit board also includes a guard ring mounted on the substrate elevated relative to the first surface of the substrate.

A third aspect of the present disclosure relates to a method of manufacturing a circuit board for a microphone assembly. The method including forming an array of substrates, forming an electrical trace in or on the substrate, and connecting a surface-mount contact on a surface of each of the substrates of the array of substrates to an electrical interface or a bond pad on an opposite surface of each of the substrates of the array of substrates. The method also includes forming a guard ring on the surface of each of the substrates, wherein the guard ring is elevated relative to the surface of the substrates.

The herein described subject matter sometimes illustrates different components contained within, or connected with, different other components. It is to be understood that such depicted architectures are illustrative, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality, and any two components capable of being so associated can also be viewed as being "operably couplable," to each other to achieve the desired functionality. Specific examples of operably couplable include but are not limited to physically mateable and/or physically interacting components and/or wirelessly interactable and/or wirelessly interacting components and/or logically interacting and/or logically interactable components.

With respect to the use of plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.).

Although the figures and description may illustrate a specific order of method steps, the order of such steps may differ from what is depicted and described, unless specified differently above. Also, two or more steps may be performed concurrently or with partial concurrence, unless specified differently above. Such variation may depend, for example, on the software and hardware systems chosen and on designer choice. All such variations are within the scope of the disclosure. Likewise, software implementations of the described methods could be accomplished with standard programming techniques with rule-based logic and other logic to accomplish the various connection steps, processing steps, comparison steps, and decision steps.

It will be further understood by those within the art that if a specific number of an introduced claim recitation is intended, such an intent will be explicitly recited in the claim, and in the absence of such recitation, no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations).

Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general, such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

Further, unless otherwise noted, the use of the words "approximate," "about," "around," "substantially," etc., mean plus or minus ten percent.

The foregoing description of illustrative embodiments has been presented for purposes of illustration and of description. It is not intended to be exhaustive or limiting with respect to the precise form disclosed, and modifications and variations are possible in light of the above teachings or may be acquired from practice of the disclosed embodiments. It is intended that the scope of the invention be defined by the claims appended hereto and their equivalents.

What is claimed is:

1. A circuit board for a microphone assembly comprising:
   a substrate comprising a first surface;
   a guard ring mounted on the substrate elevated relative to the first surface of the substrate; and
   an electrical interface comprising at least one surface-mount electrical contact on a second surface of the substrate opposite the first surface.

2. The circuit board of claim 1, wherein the guard ring is disposed around a perimeter of the circuit board and defines a perimeter wall.

3. The circuit board of claim 1, wherein the electrical trace is disposed in or on the substrate and electrically connects the surface-mount contact to an electrical interface or a bond pad on the first surface.

4. The circuit board of claim 1, wherein the substrate and the guard ring are a monolithic structure.

5. An array of circuit boards, the array of circuit boards comprising a plurality of the board of claim 1.

6. A method of manufacturing a circuit board for a microphone assembly, the method comprising:
   forming an array of substrates;
   forming an electrical trace in or on the substrate;
   connecting a surface-mount contact on a surface of each of the substrates of the array of substrates to an electrical interface or a bond pad on an opposite surface of each of the substrates of the array of substrates; and forming a guard ring on the surface of each of the substrates, wherein the guard ring is elevated relative to the surface of the substrates.

7. The method of claim 6, further comprising providing the surface of each of the substrates with a layer of dry film forming a recess extending around a perimeter of the substrate.

8. The method of claim 7, further comprising filling the recess with a guard ring material to form the guard ring.

9. The method of claim 8, wherein the guard ring material is copper.

10. The method of claim 8, further comprising removing the layer of dry film from the substrate and leaving the guard ring material.

11. The method of claim 10, further comprising removing each substrate from the array of substrates.

12. The method of claim 6, further comprising coupling a preformed guard ring to the surface of each of the substrates.

\* \* \* \* \*